United States Patent

Chen et al.

[11] Patent Number: 6,138,612
[45] Date of Patent: Oct. 31, 2000

[54] SLOW PULL DRYER WHICH CAN SMOOTHLY REMOVE PARTICLES FLOATING OVER THE SURFACE OF ITS HOT WATER TANK

[75] Inventors: Hui-Mei Chen; Yen-Hsien Ho, both of Hsin-Chi; Jui-Sheng Hsueh, Kao-Hsiung; Cheng Chen, Miao-Li; Yi-An Chen, Tao-Yuan Hsien, all of Taiwan

[73] Assignee: Trace Storage Technology Corp., Hsin-Chu, Taiwan

[21] Appl. No.: 09/421,265

[22] Filed: Oct. 20, 1999

[51] Int. Cl.$^7$ ...................................................... F22B 5/00
[52] U.S. Cl. ..................... 122/13.01; 432/210; 134/1.3; 134/25.4
[58] Field of Search ................... 122/13.01, 379, 122/381; 432/210; 134/1.3, 25.1, 25.4

[56] References Cited

U.S. PATENT DOCUMENTS

| | | | |
|---|---|---|---|
| 5,849,091 | 12/1998 | Skrovan et al. | 134/1.3 |
| 5,881,750 | 3/1999 | Yoshitani | 134/151 |
| 5,979,372 | 11/1999 | Park | 122/504.2 |

*Primary Examiner*—Denise L. Ferensic
*Assistant Examiner*—Gregory A. Wilson
*Attorney, Agent, or Firm*—Winston Hsu

[57] ABSTRACT

This invention relates to a slow pull dryer comprising a rectangular water tank and a wave eliminator. The water tank has four vertical side-walls and a bottom plate with a water hole for filling hot water wherein the hot water filled in the water tank can spill out of the water tank from the top side of one predetermined side-wall. The wave eliminator is installed at the bottom of the water tank. The lower side of the wave eliminator has a rectangular recess facing downward, and the upper side of the wave eliminator has a line-shaped opening in parallel with the predetermined side-wall. The hot water from the water hole flows into the recess and its flowing speed is slowed down in the recess. The line-shaped opening allows the hot water in the recess flow upward into the upper portion of the water tank and form a panel-shaped vertical water flow. When the vertical water flow reaches the surface of the hot water in the water tank, it will form a horizontal water flow moving toward the to side of the predetermined side wall. Particles and dusts drifting on the surface of the hot water can be carried out of the water tank by the horizontal water flow.

8 Claims, 8 Drawing Sheets

SLOW PULL DRYER WHICH CAN SMOOTHLY REMOVE PARTICLES FLOATING OVER THE SURFACE OF ITS HOT WATER TANK

BACKGROUND OF THE INVENTION

1. Field of the Invention

The present invention relates to a slow pull dryer, and more particularly, to a slow pull dryer which can smoothly remove particles floating over the surface of its hot water tank.

2. Description of the Prior Art

The slow pull dryer is commonly used in the cleaning process for removing particles. For example, during the formation of the disk, the substrate of the disk has some particles sticking on it, and these particles have to be removed to ensure the quality of the product. Therefore, in the formation of the disk, the slow pull dryer is utilized with the deionized hot water to wash off particles from the substrate of the disk.

Please refer to FIG. 1 and FIG. 2. FIG. 1 is a schematic diagram of the prior art slow pull dryer 10. FIG. 2 is a unit combination of the slow pull dryer 10 shown in FIG. 1. The prior art slow pull dryer 10 comprises a hot water tank 12 and a wave eliminator 14. The hot water tank 12 comprises four vertical side-walls 16 and a bottom plate 18 with a water hole 20 for filling hot water into the hot water tank 12. The hot water filled into the hot water tank 12 can spill out of the water tank 12 from the top sides of four vertical side-walls 16. The lower side of the wave eliminator 14 has a rectangular recess 22 facing downward. Each of the four side-walls of the wave eliminator 14 has a semicircle-shaped opening 24 for water to flow upward into the upper portion of the water tank 12. The wave eliminator 14 is installed at the bottom of the hot water tank 12, and the water hole 20 is positioned under the recess 22.

The upper side of the wave eliminator 14 contains a slope, and the wave eliminator 14 further comprises a vent pipe 28 installed on the higher end 26 of the slope. The hot water from the water hole 20 flows into the recess 22 of the wave eliminator 14 and its flowing speed is slowed down in the recess 22. The four openings 24 of the wave eliminator 14 allow the hot water in the recess 22 to flow upward into the upper portion of the water tank 12. As the water flow moves toward the top side of the vertical side-walls 16, particles and dusts drifting on the surface of the hot water can be carried out of the water tank 12 through the top side of the vertical side-walls 16. Besides, the air in the recess 22 will accumulate under the higher end 26 of the slope, and the accumulated air will pass out of the water tank 12 through the vent pipe 28.

Please refer to FIG. 3. FIG. 3 is a schematic diagram of the water flow in the water tank 12. In FIG. 3., the arrows and the helixes illustrate the flowing direction and the water turbulence, respectively. When the slow pull dryer 10 is used in the process for cleaning disks of the hard disk, the hot water from the water hole 20 into the recess 22 flows through the four openings 24 into the water tank 12 and mostly directly overflow the four vertical side-walls 16 of the water tank 12, because each position of the four opening 24 is at each of the four side-walls of the wave eliminator 14, respectively, and is very close to each of the four vertical side-walls 16 of the water tank 12, respectively. Also, the hot water forms water turbulence in the water tank 12, as shown in FIG. 3. As a result, it is very difficult for the slow pull dryer 10 to remove the particles from the substrate, and the particles drifting on the surface of the hot water will accumulate in the water tank 12 instead of flowing out of the water tank 12 which affects the quality of the process for cleaning the disk.

Because the hot deionized water is used in the slow pull dryer 10 to wash the substrate, and the hot water always comprises a lot of bubbles, the slow pull dryer 10 is equipped with the vent pipe 28 to pass the air gathered from the accumulated bubbles in the higher end 26 of the wave eliminator 14 out of the water tank 12. However, the discontinuous exhaust from the vent pipe 28 will cause the vibration of the vent pipe 28 and the water wave inside the water tank 12, therefore the substrate will have watermarks on it and hence the yield of the disks will be reduced. Besides, the discontinuous exhaust from the vent pipe 28 will generate noise as well.

SUMMARY OF THE INVENTION

It is therefore a primary objective of the present invention to provide a slow pull dryer to solve the above mentioned problems.

In a preferred embodiment, the present invention relates to a slow pull dryer comprising:

a rectangular water tank having four vertical side-walls and a bottom plate with a water hole for filling hot water into the water tank wherein the hot water filled in the water tank can spill out of the water tank from the top side of one predetermined side-wall; and a wave eliminator installed at the bottom of the water tank, the lower side of the wave eliminator having a rectangular recess facing downward and the water hole at the bottom of the water tank being positioned under the recess, and the upper side of the wave eliminator having a line-shaped opening which is in parallel with the predetermined side-wall of the water tank;

wherein the hot water from the water hole flows into the recess of the wave eliminator and its flowing speed is slowed down in the recess, and the line-shaped opening at the upper side of the wave eliminator allows the hot water in the recess to flow upward into the upper portion of the water tank and form a panel-shaped vertical water flow wherein when the vertical water flow reaches the surface of the hot water in the water tank, it will form a horizontal water flow moving toward the top side of the predetermined side wall whereby particles and dusts drifting on the surface of the hot water can be carried out of the water tank by the horizontal water flow.

It is an advantage of the present invention that the water in the water tank will form a stable water flow and particles and dusts drifting on the surface of the water can be carried out of the water tank easily.

These and other objective of the present invention will no doubt become obvious to those of ordinary skill in the art after reading the following detailed description of the preferred embodiment which is illustrated in the various figures and drawings.

DETAILED DESCRIPTION OF THE PREFERRED EMBODIMENT

Figure 1:
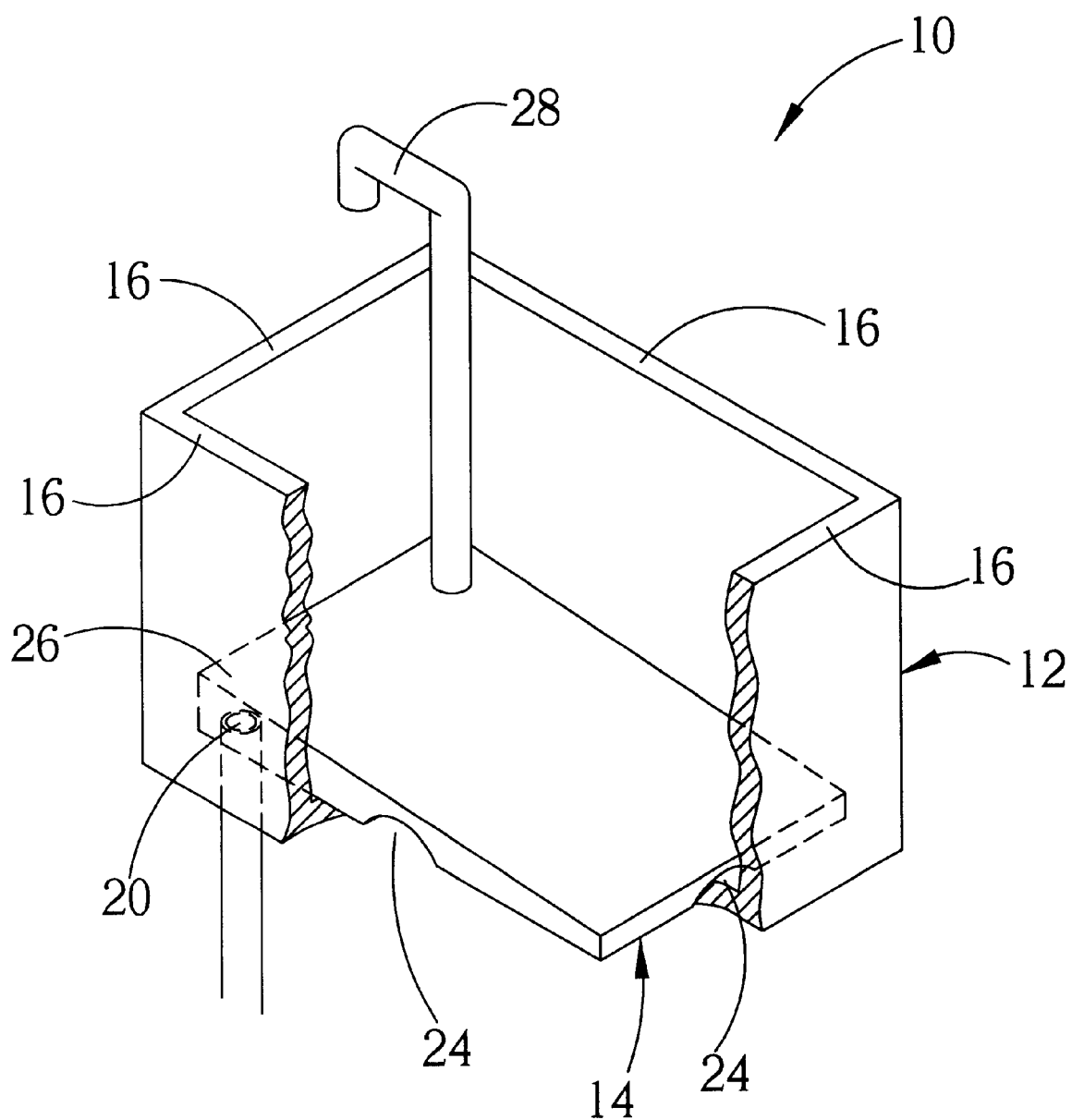
FIG. 1 is a schematic diagram of the prior art slow pull dryer.
Figure 2:
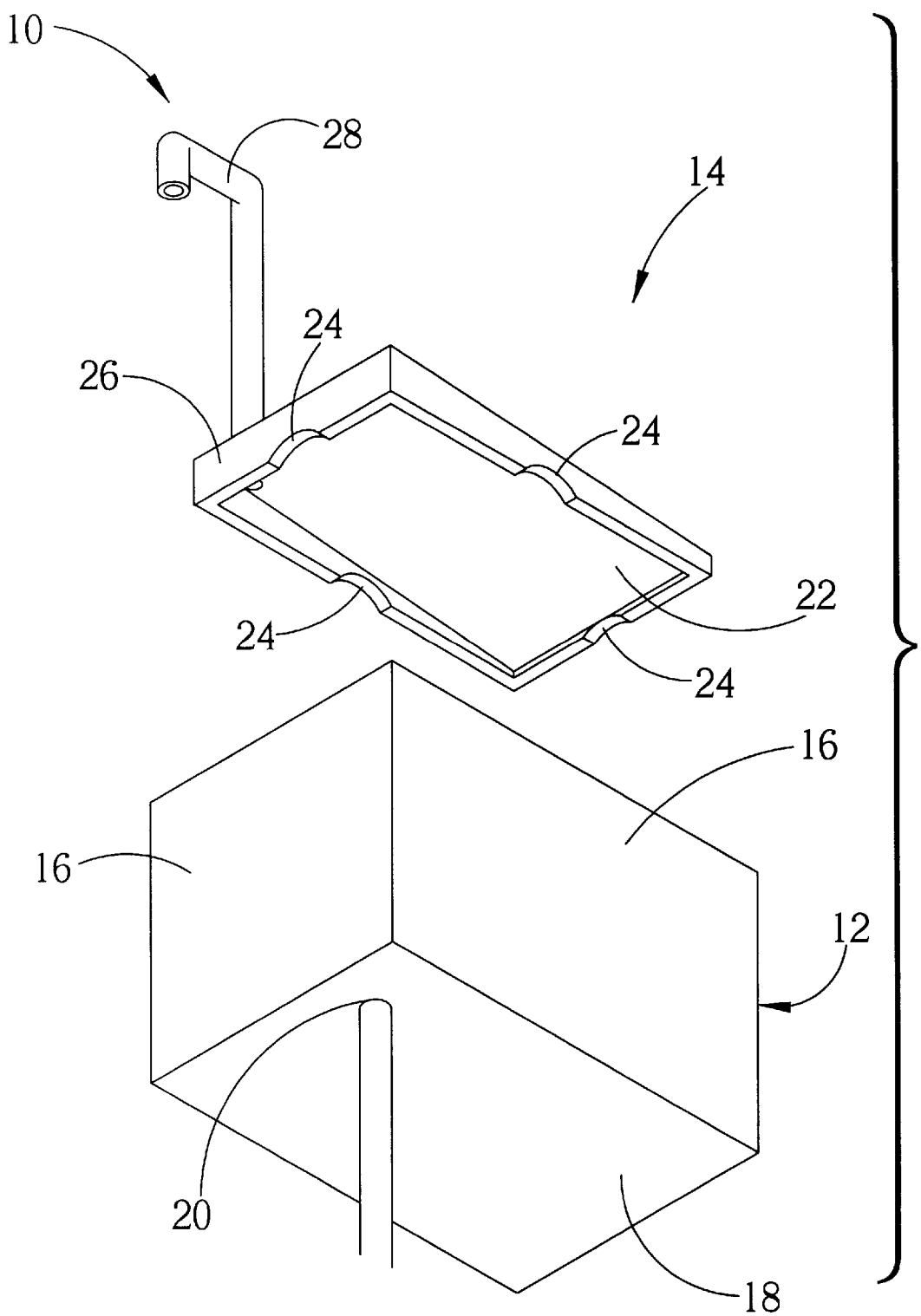
FIG. 2 is a unit combination of the slow pull dryer shown in FIG. 1.
Figure 3:
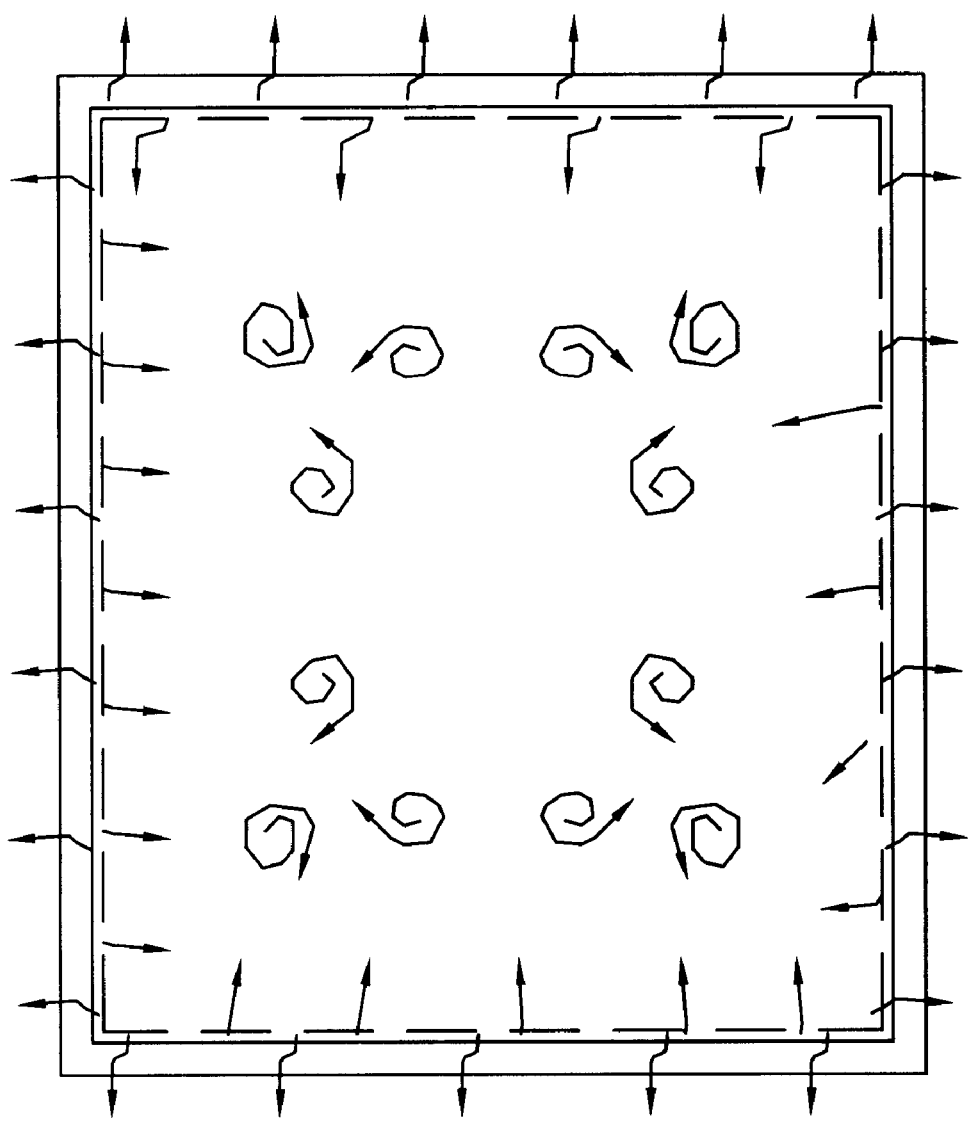
FIG. 3 is a schematic diagram of the water flow in the water tank.
Figure 4:
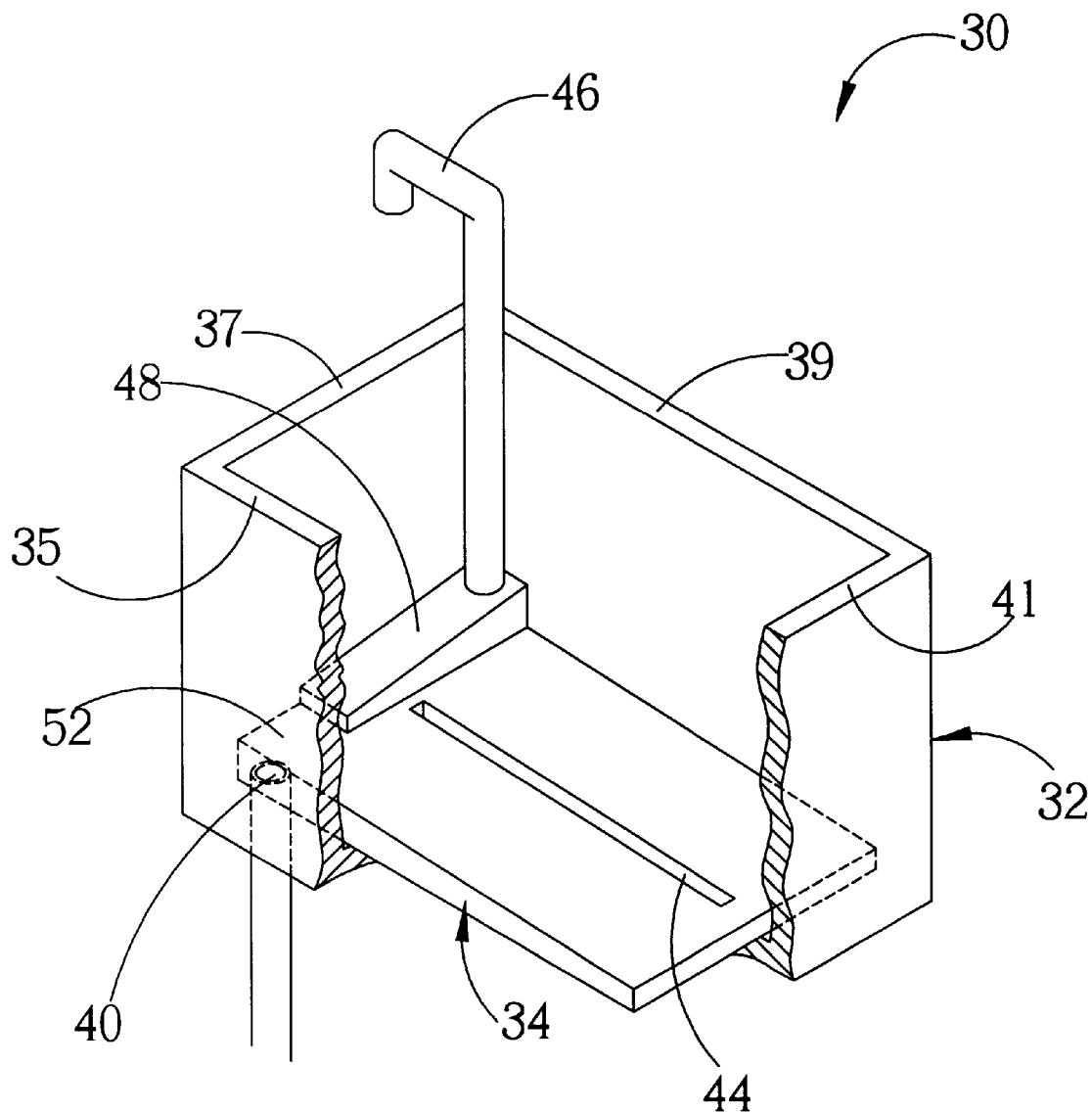
FIG. 4 is a schematic diagram of the slow pull dryer according to the present invention.
Figure 5:
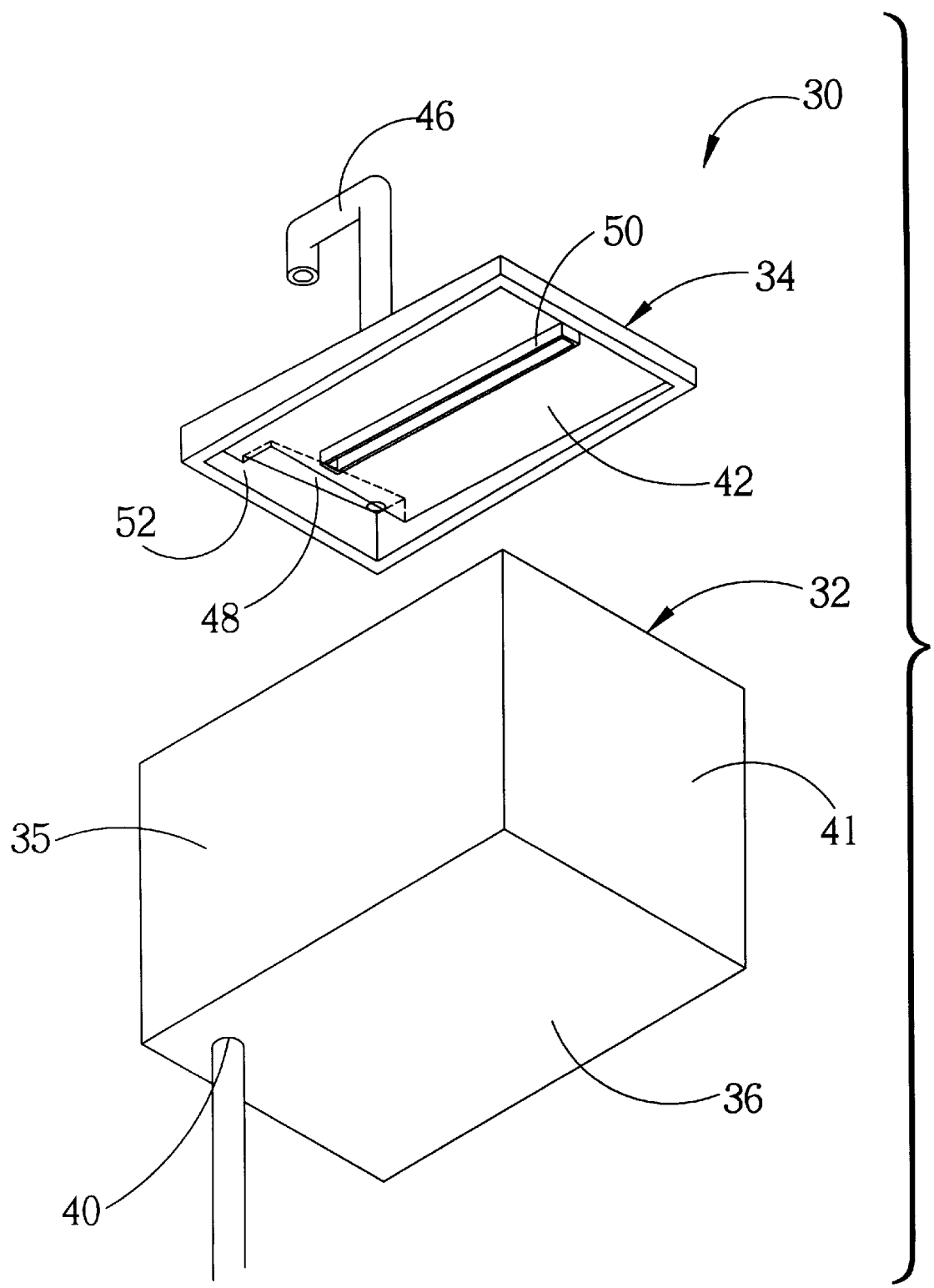
FIG. 5 is a unit combination of the slow pull dryer shown in FIG. 4.

Please refer to FIG. 4 and FIG. 5. FIG. 4 is a schematic diagram of a slow pull dryer 30 according to the present invention. FIG. 5 is a unit combination of the slow pull dryer 30 shown in FIG. 4. The slow pull dryer 30 in the present invention comprises a rectangular water tank 32 and a wave eliminator 34 in a rectangular shape. The water tank 32 has four vertical side-walls 35,37,39,41, and a bottom plate 36 with a water hole 40. The water hole 40 is installed on the lower side of the water tank 32, and is used for filling hot water into the water tank 32. The hot water filled in the water tank 32 can spill out of the water tank 32 from the top sides of the four vertical side-walls 35,37,39,41. The wave eliminator 34 is installed at the bottom of the water tank 32. The lower side of the wave eliminator 34 has a rectangular recess 42 facing downward, and the water hole 40 at the bottom of the water tank 32 is positioned under the recess 42. The upper side of the wave eliminator 34 has a line-shaped opening 44 which is in parallel with the side-walls 35,39 of the water tank 32.

The hot water from the water hole 40 flows into the recess 42 of the wave eliminator 32 and its flowing speed is slowed down in the recess 42. The line-shaped opening 44 at the upper side of the wave eliminator 34 allows the hot water in the recess 42 flow upward into the upper portion of the water tank 32 and form a panel-shaped vertical water flow. When the vertical water flow reaches the surface of the hot water in the water tank 32, it will form stable horizontal water flows. The flowing direction of the horizontal water flows are perpendicular to the four side-walls 35,37,39,41. The horizontal water flows move toward the top sides of the four side-walls 35,37,39,41 whereby particles and dusts drifting on the surface of the hot water can be carried out of the water tank 32 through the top sides of the four side-walls 35,37, 39,41 by the horizontal water flow.

The wave eliminator 34 further comprises a vent pipe 46, a tilted groove 48 and a downward protruding flange 50. The upper side of the wave eliminator 34 contains a slope for carrying the bubbles accumulated in the recess 42 to the higher end 52 of the wave eliminator 34. The vent pipe 46 of the wave eliminator 34 is connected to the higher end 52 for passing the air gathered from the accumulated bubbles in the higher end 52 out of the recess 42. The tilted groove 48 is at the higher end 52, and the vent pipe 46 is connected to the top end of the tilted groove 48 whereby the bubbles accumulated at the higher end 52 can continuously flow into the vent pipe 46 through the tilted groove 48 so as to prevent the bubbles from accumulating at the higher end 52. The downward protruding flange 50 is installed around the lower side of the line-shaped opening 44 for preventing bubbles accumulated in the recess 42 from flowing into the water tank 32 through the line-shaped opening 44.

Figure 6:
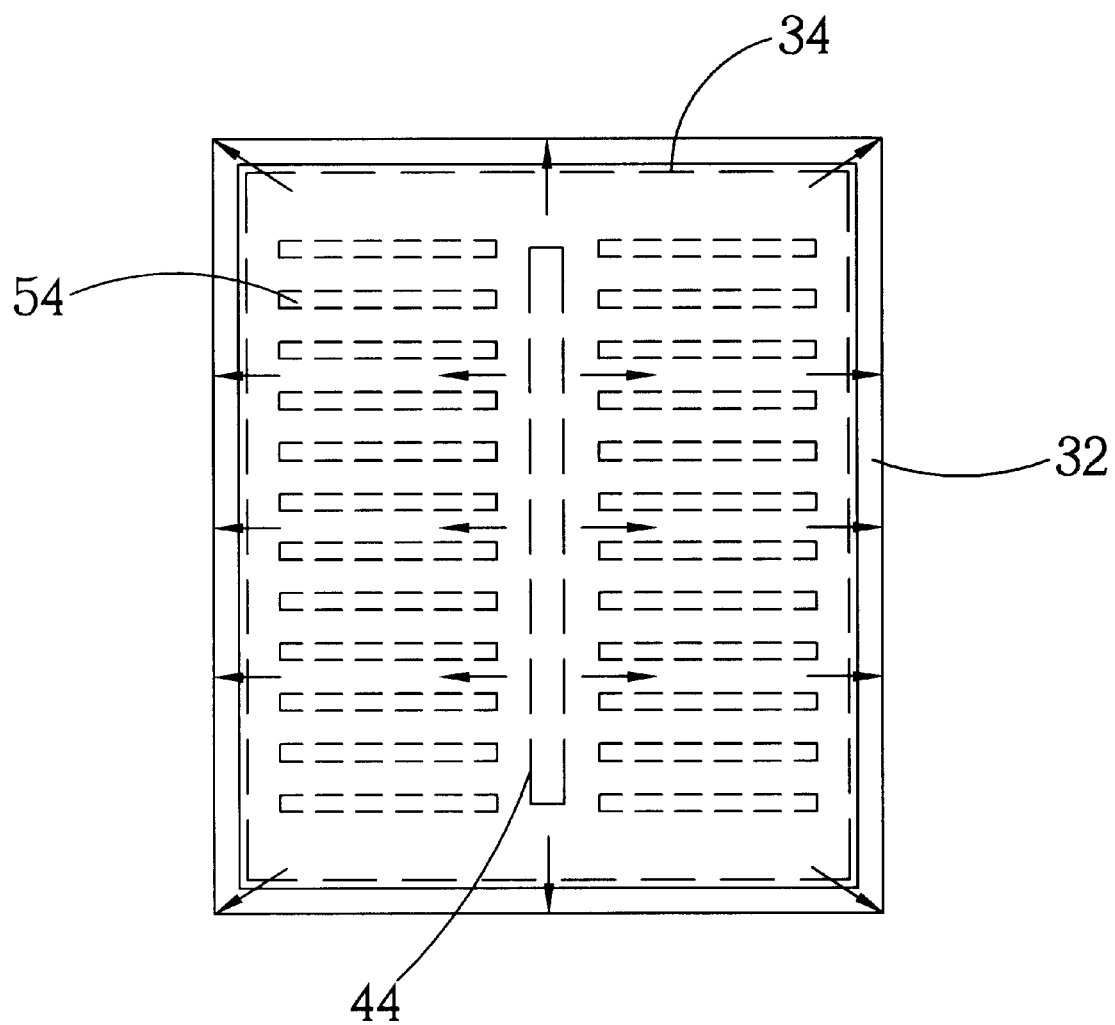
FIG. 6 is a schematic diagram of the water flow in the water tank.

Please refer to FIG. 6. FIG. 6 is a schematic diagram of the water flow in the water tank 32. The arrows in FIG. 6 illustrate the directions of the water flows. The slow pull dryer 30 of the present invention can be applied in the process for cleaning the substrate of the disk or the semiconductor wafer. When cleaning a plurality of the substrates 54, the substrates 54 are vertically loaded into a carrier (not shown) in parallel. When cleaning the substrates 54, the carrier is completely dipped into the hot water in the hot water tank 32 and then slowly pulled out of the hot water. The particles on the substrates 54 will be removed because of the surface tension of the hot water. When the carrier is leaving the hot water, the surfaces of the substrates 54 are in line with the horizontal water flow, so the horizontal water flow can smoothly flow through the surfaces of the substrates 54 and then flow out of the water tank 32 through the top sides of the vertical side-walls 35,37,39,41. Furthermore, the slow pull dryer 30 of the present invention can also be applied in the process for cleaning a plurality of disks or semiconductor wafers.

In the slow pull dryer 30, the line-shaped opening 44 of the wave eliminator 34 is in parallel with the vertical side-walls 35,37. The hot water from the water hole 40 flows through the line-shaped opening 44 and upward into the upper portion of the water tank 32, and forms the panel-shaped vertical water flow. When the vertical water flow reaches the surface of the hot water in the water tank 32, it splits and forms the horizontal water flows which are in line with the surfaces of the substrates 54 and smoothly flow through the surfaces of the substrates 54. Therefore, no water turbulence is produced, and particles and dusts drifting on the surface of the hot water are carried out of the water tank 32 by the horizontal water flows. Besides, the titled groove 48 is positioned at the higher end of the wave eliminator 34, so the accumulated bubbles at the higher end 52 of the wave eliminator 34 can continuously flow into the vent pipe 46. This continuous exhaust design can prevent the vent pipe 46 from vibrating and the hot water from producing waves, and hence the watermark problem of the substrates 54 and the noise problem can be avoided. Therefore, the slow pull dryer 30 of the present invention can enhance the quality of the process for cleaning substrates or disks.

Figure 7:
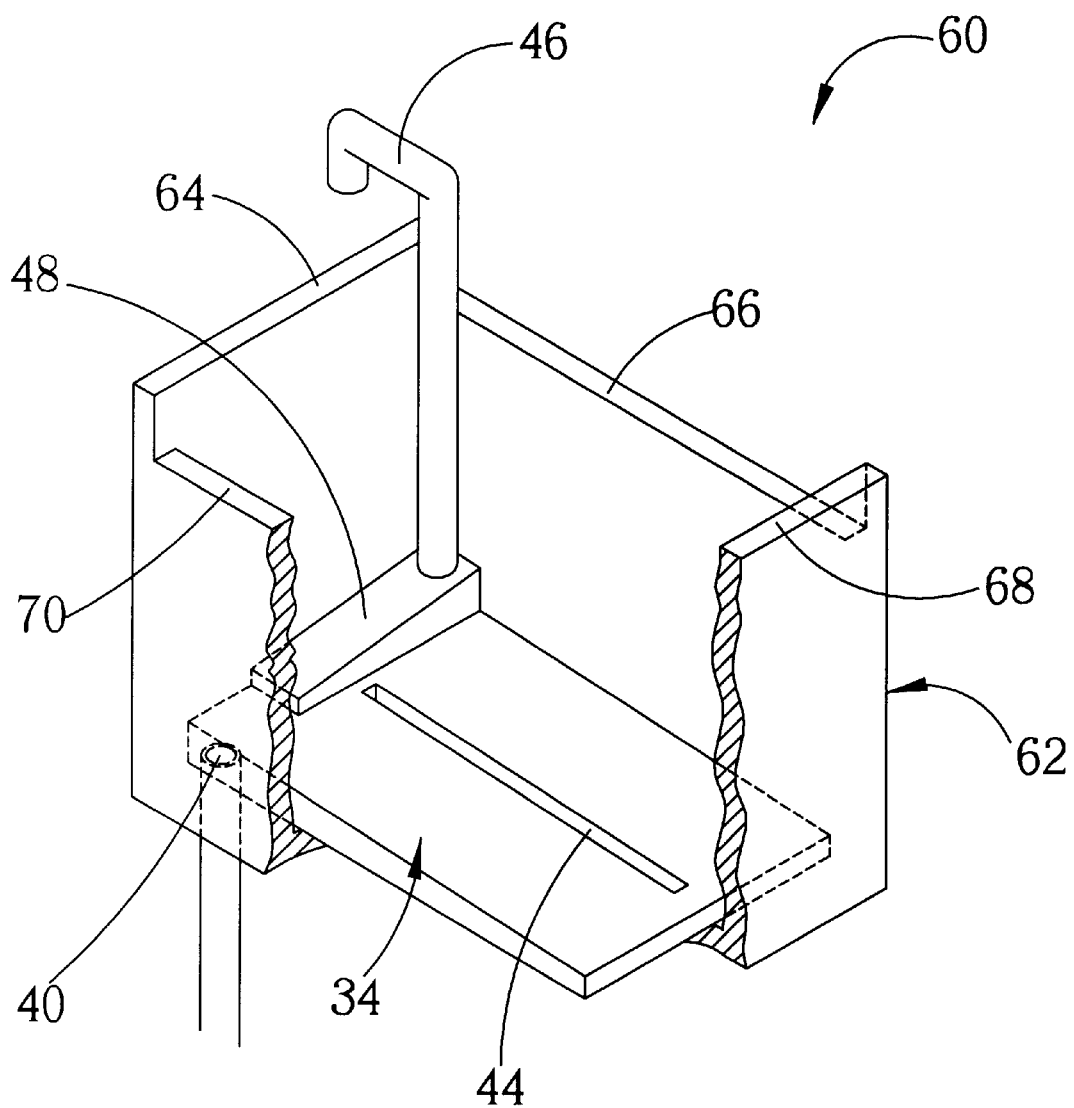
FIG. 7 is a schematic diagram of an alternative slow pull dryer according to the present invention.

Please refer to FIG. 7. FIG. 7 is a schematic diagram of an alternative slow pull dryer according to the present invention. The difference between the slow pull dryer 60 in this embodiment and the slow pull dryer 30 is the structure of the vertical side-walls. The following description focuses on the vertical side-walls of the slow pull dryer 60. The water tank 62 of the slow pull dryer 60 comprises four vertical side-walls 64,66,68,70 wherein the vertical side-walls 64,68 are higher than the vertical side-walls 66,70, and the vertical side-walls 66,70 are in parallel with the line-shaped opening 44 of the wave eliminator 34.

Figure 8:
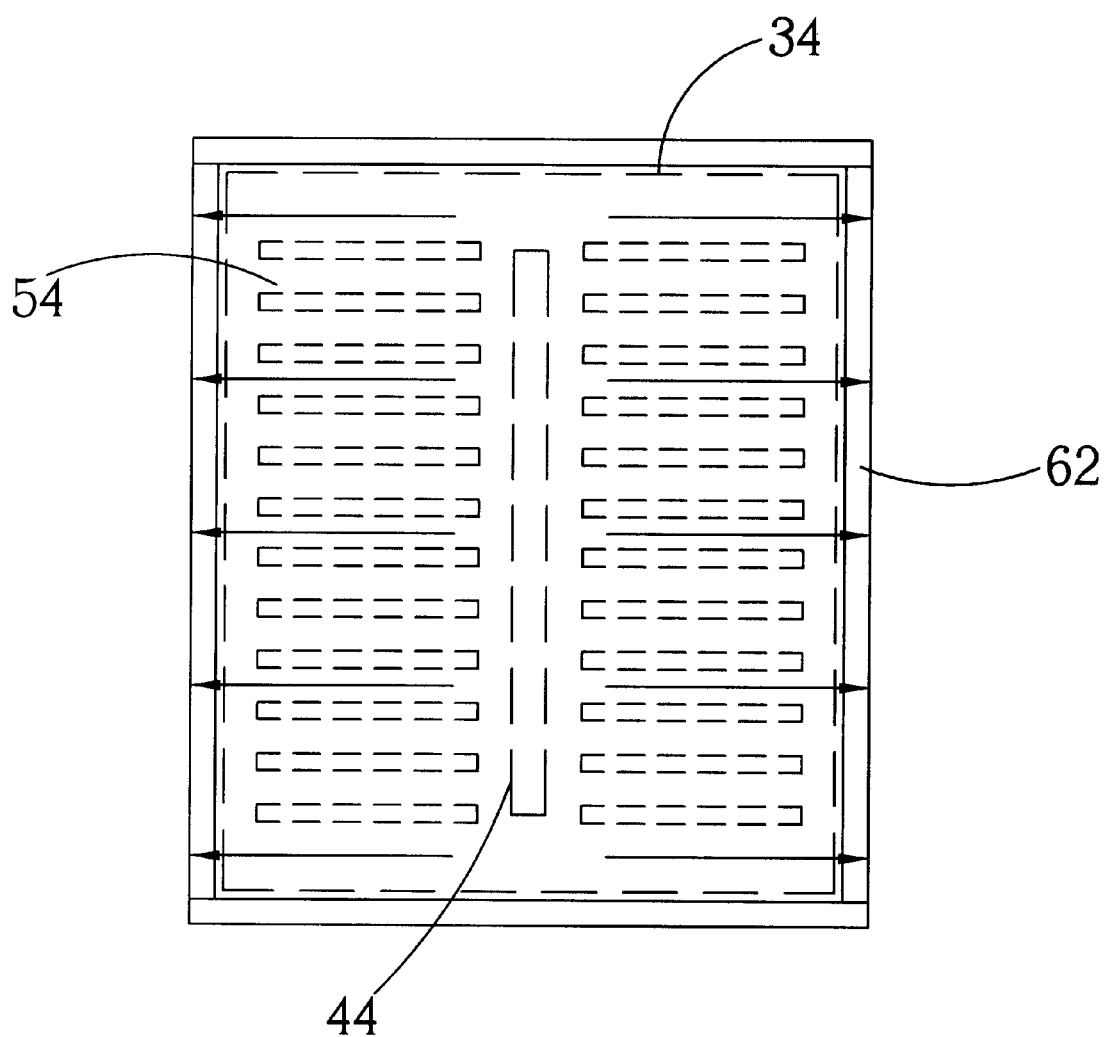
FIG. 8 is a schematic diagram of the water flow in the water tank shown in FIG. 7.

Please refer to FIG. 8. FIG. 8 is a schematic diagram of the water flow in the water tank 62 shown in FIG. 7. The arrows in FIG. 8 illustrate the flowing directions. When the hot water from the water hole 40 flows through the line-shaped opening 44 into the water tank 62, the line-shaped opening 44 allows the hot water flow upward into the upper portion of the water tank 62 and form a panel-shaped vertical water flow. When the vertical water flow reaches the surface of the hot water, it will split and form two horizontal water flows moving toward the top sides of the two vertical side-walls 66,70 whereby particles and dusts drifting on the surface of the hot water can be carried out of the water tank 62 through the top side of the side-walls 66,67 by the two horizontal water flows.

In contrast to the prior art slow pull dryer 10, the wave eliminator 34 of the slow pull dryers 30, 60 according to the present invention has a line-shaped opening 44 to guide the hot water flowing into the water tank 32,62. Since the line-shaped opening 44 is in parallel with the vertical side-walls 35,39 of the water tank 30 or the vertical side-walls 66,70 of the water tank 60, the hot water will form stable horizontal water flow on the surface of the hot water in the water tank 32,62 and smoothly flow through the surface of the substrates 54 or the disks. The horizontal water flow will move toward the top sides of the vertical side-walls and carry particles and dusts drifting on the surface of the hot water out of the water tank 32. Besides, the wave eliminator 34 of the slow pull dryers 30, 60 of the present invention has the tilted groove 48 to allow the bubbles accumulated at the higher end of the wave eliminator 34 to continuously flow into the vent pipe 46 through the tilted groove 48. This continuous exhaust design can prevent the vent pipe 64 from vibrating, and hence the watermark problem of the substrates 54 or the disk and the noise problem can be avoided. Therefore, the slow pull dryer of the present invention can improve the quality of the process for cleaning the substrates 54 or the disks.

Those skilled in the art will readily observe that numerous modifications and alternations of the device may be made while retaining the teachings of the invention. Accordingly, the above disclosure should be construed as limited only by the metes and bounds of the appended claims.

What is claimed is:

1. A slow pull dryer comprising:

a rectangular water tank having four vertical side-walls and a bottom plate with a water hole for filling hot water into the water tank wherein the hot water filled in the water tank can spill out of the water tank from the top side of one predetermined side-wall; and a wave eliminator installed at the bottom of the water tank, the lower side of the wave eliminator having a rectangular recess facing downward and the water hole at the bottom of the water tank being positioned under the recess, and the upper side of the wave eliminator having a line-shaped opening which is in parallel with the predetermined side-wall of the water tank;

wherein the hot water from the water hole flows into the recess of the wave eliminator and its flowing speed is slowed down in the recess, and the line-shaped opening at the upper side of the wave eliminator allows the hot water in the recess flow upward into the upper portion of the water tank and form a panel-shaped vertical water flow wherein when the vertical water flow reaches the surface of the hot water in the water tank, it will form a horizontal water flow moving toward the top side of the predetermined side wall whereby particles and dusts drifting on the surface of the hot water can be carried out of the water tank by the horizontal water flow.

2. The slow pull dryer of the claim 1 wherein the flowing direction of the horizontal water flow is perpendicular to the predetermined side-wall.

3. The slow pull dryer of the claim 1 wherein the wave eliminator further comprises a downward protruding flange installed around the lower side of the line-shaped opening for preventing bubbles accumulated in the recess from flowing into the water tank through the line-shaped opening.

4. The slow pull dryer of the claim 1 wherein the hot water in the water tank also spills from the top side of another side-wall parallel to the predetermined side wall wherein when the vertical water flow from the line-shaped opening reaches the surface of the hot water, it will split and form two horizontal water flows moving toward the top sides of the two side-walls whereby particles and dusts drifting on the surface of the hot water can be carried out of the water tank by the two horizontal water flows.

5. The slow pull dryer of the claim 1 wherein the upper side of the wave eliminator contains a slope for carrying the bubbles accumulated on the wave eliminator to a higher end of the eliminator, and the wave eliminator further comprises a vent pipe connected to the higher end for passing the air gathered from the accumulated bubbles in the higher end out of the water tank.

6. The slow pull dryer of the claim 5 wherein the wave eliminator further comprises a tilted groove at the higher end of the eliminator and the vent pipe is connected to the top end of the tilted groove whereby the bubbles accumulated at the higher end can continuously flow into the vent pipe through the tilted groove.

7. The slow pull dryer of the claim 1 wherein the slow pull dryer is used for cleaning a plurality of substrates for disk or wafer, and the substrates are vertically loaded into a carrier in parallel for cleaning, wherein when cleaning the substrates, the carrier is completely dipped into the hot water in the hot water tank and then slowly pulled out of the hot water, and when the carrier is leaving the hot water, the surfaces of the substrates are in line with the horizontal water flow so the horizontal water flow can smoothly flow through the surfaces of the substrates and then flow out of the water tank through the top side of the predetermined side-wall.

8. The slow pull dryer of the claim 1 wherein the slow pull dryer is used for cleaning a plurality of disks, and a plurality of disks are vertically loaded into a carrier in parallel for cleaning, wherein when cleaning the disks, the carrier is completely dipped into the hot water in the hot water tank and then slowly pulled out of the hot water, and when the carrier is leaving the hot water, the surfaces of the disks are in line with the horizontal water flow so the horizontal water flow can smoothly flow through the surfaces of the disks and then flow out of the water tank through the top side of the predetermined side-wall.

* * * * *